(12) United States Patent
Gao

(10) Patent No.: US 11,388,833 B2
(45) Date of Patent: Jul. 12, 2022

(54) MODULAR-BASED SOLUTION FOR SERVER RACK ARCHITECTURE

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 189 days.

(21) Appl. No.: 16/784,115

(22) Filed: Feb. 6, 2020

(65) Prior Publication Data

US 2021/0251097 A1 Aug. 12, 2021

(51) Int. Cl.
*H05K 7/14* (2006.01)
*H05K 7/20* (2006.01)

(52) U.S. Cl.
CPC ......... *H05K 7/1489* (2013.01); *H05K 7/1401* (2013.01); *H05K 7/1492* (2013.01); *H05K 7/1497* (2013.01); *H05K 7/20736* (2013.01); *H05K 7/20781* (2013.01)

(58) Field of Classification Search
None
See application file for complete search history.

(56) References Cited

U.S. PATENT DOCUMENTS

| | | | | |
|---|---|---|---|---|
| 5,544,146 A * | 8/1996 | Luffel | ................. | G11B 17/225 369/30.45 |
| 5,646,917 A * | 7/1997 | Miyoshi | ............... | G11B 17/225 369/30.34 |
| 5,695,078 A * | 12/1997 | Otema | ................. | A47B 57/045 108/108 |
| 6,025,972 A * | 2/2000 | Schmidtke | ........... | G11B 17/225 360/98.06 |
| 6,116,063 A * | 9/2000 | Foslien | ................... | G06F 1/181 312/218 |
| 6,160,677 A * | 12/2000 | Chiba | ................. | G11B 15/683 360/92.1 |
| 6,166,877 A * | 12/2000 | Tadokoro | ........... | G11B 15/6815 360/92.1 |
| 6,449,223 B1 * | 9/2002 | Kanetsuku | ......... | G11B 15/6835 211/41.12 |
| 6,515,822 B1 * | 2/2003 | White | ................ | G11B 15/6835 360/92.1 |
| 6,798,612 B2 * | 9/2004 | Smith | ................ | G05B 19/4068 360/92.1 |
| 6,956,715 B2 * | 10/2005 | Mueller | ............. | G11B 15/6835 360/92.1 |
| 6,983,469 B2 * | 1/2006 | Steinhilber | .......... | G11B 17/225 369/30.39 |

(Continued)

*Primary Examiner* — Xanthia C Cunningham
(74) *Attorney, Agent, or Firm* — Womble Bond Dickinson (US) LLP

(57) ABSTRACT

Embodiments are disclosed of a module attachable to an electronics rack. The module includes a housing attachable to a rear part of the electronics rack. One or more pairs of laterally-running mounting channels are positioned within the housing and one or more service panels are positioned within the housing. Each of the one or more service panels is movably mounted to a corresponding pair of mounting channels, and each of the one or more service panels can be coupled to at least one electronic device to be mounted in the electronics rack. Implementing the modules to racks and data centers can be realized with multiple methods.

19 Claims, 5 Drawing Sheets

(56) References Cited

U.S. PATENT DOCUMENTS

| | | | | |
|---|---|---|---|---|
| 7,032,862 B2* | 4/2006 | Landes | .............. | B64D 43/00 |
| | | | | 244/129.1 |
| 7,499,242 B2* | 3/2009 | Hoelsaeter | ............ | G11B 15/68 |
| | | | | 360/92.1 |
| 8,132,772 B1* | 3/2012 | Thomas | .............. | F16C 29/004 |
| | | | | 248/500 |
| 8,550,260 B1* | 10/2013 | Vircks | ................ | H05K 7/1412 |
| | | | | 211/26 |
| 8,582,299 B1* | 11/2013 | Phillips | ................ | G06F 1/181 |
| | | | | 361/724 |
| 9,601,149 B1* | 3/2017 | Todd | ................ | G11B 15/6885 |
| 9,955,607 B1* | 4/2018 | Valentine | ............ | H05K 7/1488 |
| 9,986,653 B2* | 5/2018 | Salinas | .............. | H05K 5/0213 |
| 10,136,556 B2* | 11/2018 | Bilski | ................ | H05K 7/1487 |
| 10,244,652 B1* | 3/2019 | Czamara | ............ | H05K 7/20745 |
| 10,349,557 B2* | 7/2019 | Bilski, Jr. | ......... | H05K 7/20681 |
| 10,383,250 B1* | 8/2019 | Paterra | .............. | H05K 7/1489 |
| 10,648,613 B1* | 5/2020 | Anonen | ............ | F16M 11/045 |
| 2004/0133902 A1* | 7/2004 | Luffel | ................ | G11B 17/225 |
| | | | | 360/92.1 |
| 2007/0110255 A1* | 5/2007 | Barath | ............ | G10K 11/17819 |
| | | | | 381/71.5 |
| 2009/0129885 A1* | 5/2009 | Csik | .................... | F16B 37/046 |
| | | | | 411/103 |
| 2010/0294906 A1* | 11/2010 | Klepack | .............. | B65G 21/06 |
| | | | | 248/231.9 |
| 2017/0347497 A1* | 11/2017 | LeFebvre | ......... | H05K 7/20836 |
| 2019/0037729 A1* | 1/2019 | Jochim | ............ | H05K 7/20745 |
| 2020/0146189 A1* | 5/2020 | Chien | .................... | G06F 1/20 |

* cited by examiner

MODULAR-BASED SOLUTION FOR SERVER RACK ARCHITECTURE

TECHNICAL FIELD

The disclosed embodiments relate generally to server racks and in particular, but not exclusively, to server racks with a modular-based architecture.

BACKGROUND

Hardware system requirements in the cloud computing era are dynamic. Hardware deployed in a cloud infrastructure can be very different for different business, and the differences can be not only the operating parameters and form factors, but also the power delivering requirement, cooling requirement, networking requirements, etc. And the IT hardware used in data centers changes frequently for several reasons: cloud business requirements change frequently; server lifetime is much shorter than the facility infrastructure; the technology and product renewal of server hardware and the component are fast.

There are currently many types of standard server rack configurations, such as ODCC Scorpio rack, OCP rack, and 19" standard rack. But the majority of current server racks are specified for certain categories of hardware or systems, which means they are inflexible and cannot be used for other hardware or systems. Server hardware populated on these racks is also customized and can only be used on the corresponding racks. This is not only a challenge to the end users, but also a challenge to the entire data center ecosystem—sever vendors, rack vendors, corresponding component providers, power system vendors, thermal system vendors, and so on. This not only impact on the cloud services but also significantly impact on the cost.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments are described of an apparatus and system for an electronics rack including a rear module. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The disclosed embodiments solve the challenges that exist in the current hardware and infrastructure solutions and architectures. A system-level infrastructure for rack and data center is described for the disclosed embodiments. A rack rear module is introduced for rack deployment and operation in data centers. The rear module is attached to the back side of a rack, and different cooling, power delivering and networking transportation service panels are positioned in the rear module. Service panels can include, among other things, a liquid cooling fluid distribution panel, an air cooling fan system panel, a power distribution unit (PDU) panel, a busbar power delivery panel, and a high-speed data cable panel, and maybe other networking cable panels. These modules are assembled on the rear module and is being able to manufactured, assembled and serviced independently from the racks. The rack rear module includes mounting channels and bearing structures for assembling and serving the service panels in it. Several flexible deployment schemes for the racks and data centers are disclosed to satisfy dynamics requirements of different types of IT equipment installation for supporting different internet services and cloud services computing.

Figure 1:
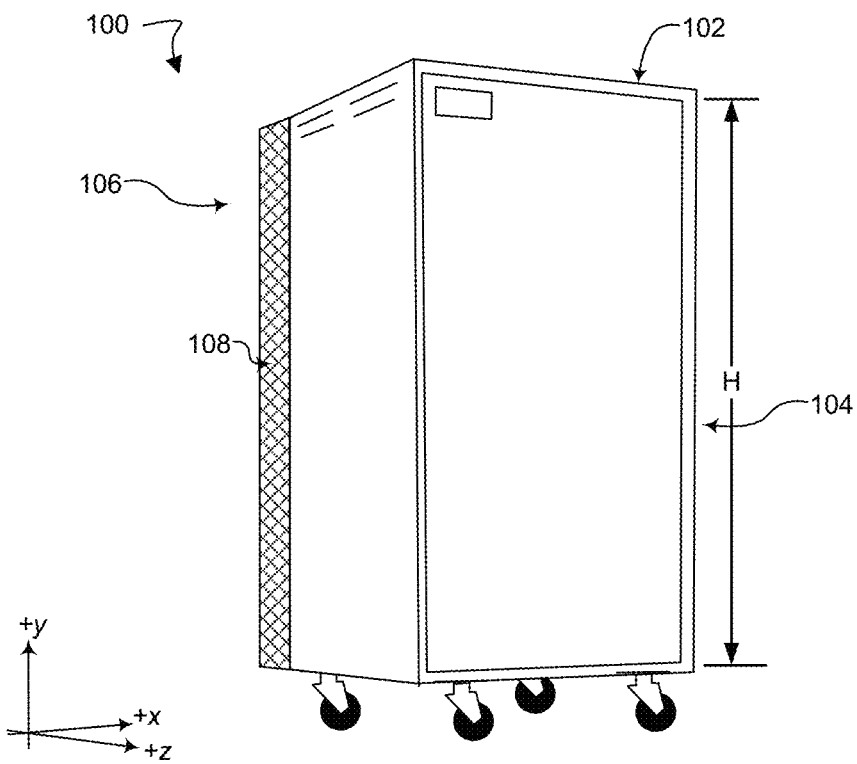
FIG. 1 is a perspective side view of an embodiment of an electronics rack, such as a server rack or an IT rack, including a rear module.

FIG. 1 illustrates an embodiment of an electronics rack 100. Electronics rack 100 includes a rack 102 having a front 104 and a rear 106. A rear module 108 is coupled to the rear 106 of rack 102, so that rear module 108 increases the depth of basic rack 102 and provides space for support functions as further discussed below. As used herein, the term "depth" refers to dimensions, positions along, or motions along the direction between front 104 and back 106—that is, in the ±z directions illustrated in the figure. For instance, if one element is positioned at the same depth as another, both elements have the same z coordinate, and if one element is positioned at a different depth than another, the elements have different z coordinates. Similarly, the terms "width," "lateral," or "laterally" refer to dimensions, positions along, or motions along the ±x directions illustrated in the figure, and the terms "top," "bottom," "height," "vertical," or "vertically" refer to dimensions, positions, or motions along the ±y direction illustrated in the figure.

Figure 2A:
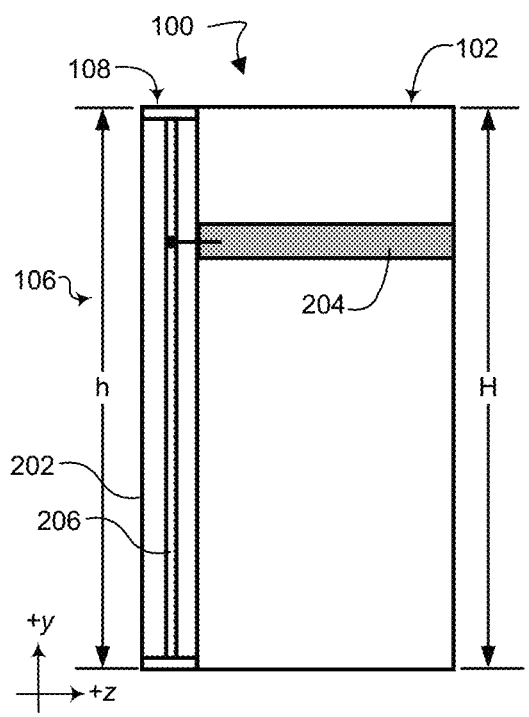
FIG. 2A is a side view of an embodiment of an electronics rack such as a server rack or an IT rack, including a rear module.
Figure 2B:
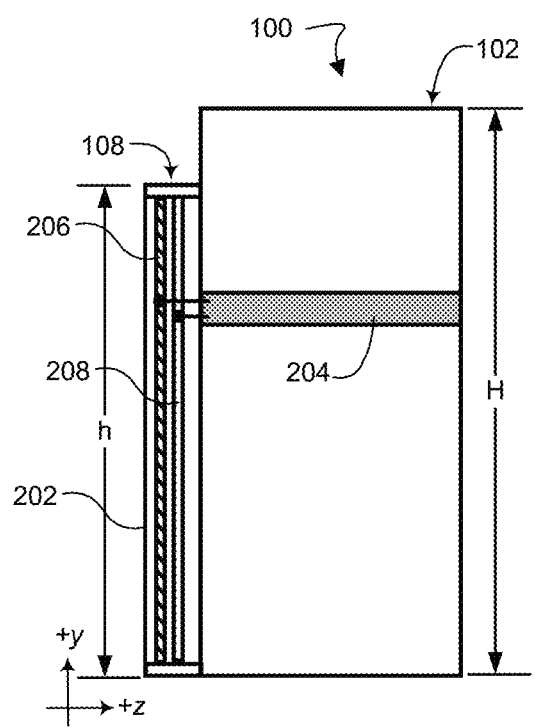
FIG. 2B is a side view of another embodiment of an electronics rack, such as a server rack or an IT rack, including a rear module.

FIGS. 2A-2B illustrate embodiments of electronics rack 100. In each embodiment, rack 102 has an electronic device 204 such as a server or router, mounted therein. Rear module 108 includes a housing 202 within which are one or more service panels, such as service panels 206 and 208, that can be coupled to, and provide services to, electronic device 204. Details of embodiments of rear module 108 are further described below in connection with FIGS. 3-7. FIG. 2A illustrates an embodiment in which rear module 108 is a full-height module, meaning that rear module 108 has a height h that is substantially equal to height H of basic rack 102. FIG. 2B illustrates an embodiment in which rear module 108 has a height h that is less than the height H of basic rack 102. Having different available heights h for rear module 108 provides implementation flexibility. The height or form factor of the module can be different depending on actual needs, for both the height, the width and the depth. The figure shows power, cooling, and networking connections between service panels 206 and 208 and the electronic device 204; different connecting methods can be used in different embodiments, such as cable connections which require manual operation or blind-mating connection methods.

Figure 3:
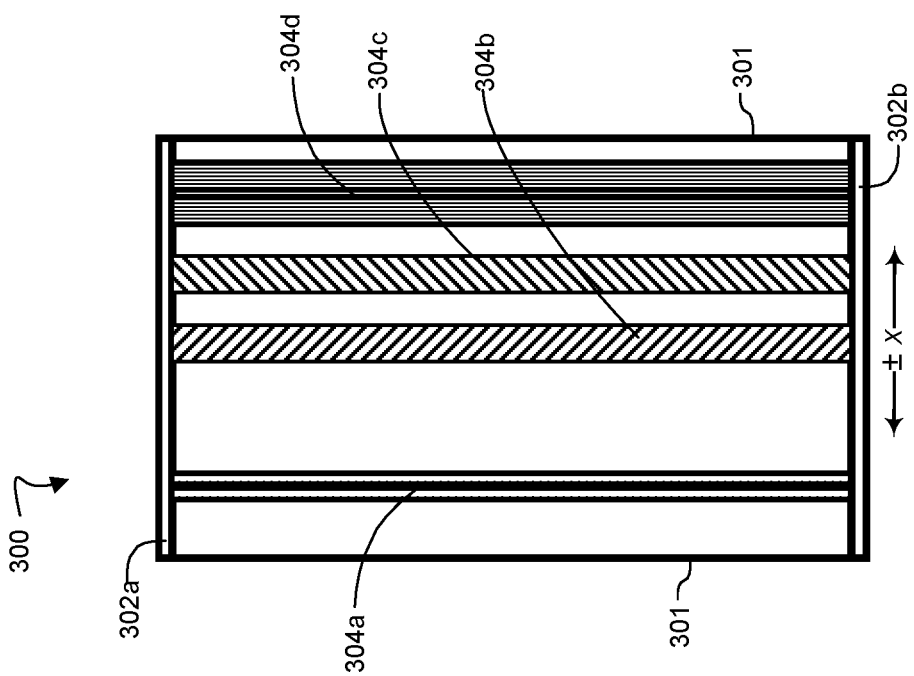
FIG. 3 is a rear view of an embodiment of a rear module for use with an electronics rack such as a server rack or an IT rack.

FIG. 3 illustrates an embodiment of a rear module 300. Rear module 300 includes a housing 301. Because it is two-dimensional, the figure shows one pair of mounting channels: mounting channel 302a at or near the top of housing 301, and mounting channel 302b at or near the bottom of housing 301. But embodiments can include more than one pair of mounting channels 302, with each pair being located at substantially the same depth within rear module 300 (see, e.g., FIG. 5). Put differently, each pair of mounting channels 302 defines a plane, such that in an embodiment with multiple pairs of mounting channels, corresponding pairs mounting channels define multiple planes that are parallel to each other and spaced apart from each other (see, e.g., FIG. 5).

One or more service panels 304 are positioned within housing 301. Each service panel 304 has hardware mounted thereon or therein that services one or more of the electronic devices that will be positioned within the rack to which rear module 300 will be coupled. The illustrated embodiment includes four service panels 304a-304d, but other embodiments can include more or less panels than shown. In the illustrated embodiment service panel 304a can be a busbar (i.e., electrical power distribution) panel, service panel 304b a power distribution unit (PDU) panel, service panel 304c a high speed data cable panel, and service panel 304d a fluid manifold for liquid cooling distribution systems. Other embodiments can, of course, have different service panels than shown, including service panels that perform functions not listed here. Other embodiments can also include multiple instances of the same service panel—multiple fluid manifolds 304d, for instance. Still other embodiments can combine multiple functions on the same service panel—e.g., a manifold and a PDU on the same service panel.

Each service panel 304 is movable mounted on a corresponding pair of mounting channels that are positioned at substantially the same depth within housing 301, so that each service panel 304 can easily be moved laterally (i.e., in the x direction) in the housing. Bearings can be positioned between the service panels and the mounting channels for smooth relative motion between the two. This allows the service panels to be easily positioned and repositioned in the housing as the electronic devices mounted in the rack change. Bearings are one of the feasible means to satisfy this requirement, but in other embodiments other components or structure can be implemented. Because of the way the mounting channels are positioned (see above and FIG. 5), each service panel moves in a plane that is spaced apart from the plane in which other service panels move. As a result, each service panel can be moved laterally in the housing without interfering with other service panels. In actual use, these service panels can be configured and then installed on the rear module based on actual rack and server requirement as well as availability of the data center facility.

Figure 4:
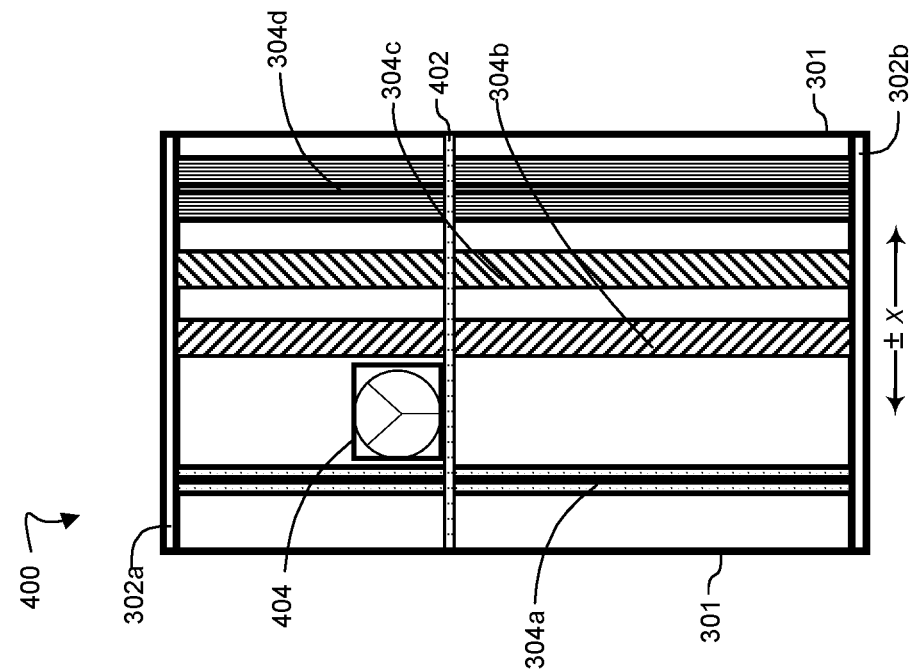
FIG. 4 is a rear view of another embodiment of a rear module for use with an electronics rack such as a server rack or an IT rack.

FIG. 4 illustrates another embodiment of a rear module 400. Rear module 400 is in most respects similar to rear module 300: it includes housing 301, mounting channels 302, and service panels 304a-304d. The primary difference between rear modules 400 and 300 is that rear module 400 can support additional functions besides those provided by service panels 304a-304d. In the illustrated embodiment additional framework 402 is positioned in housing 301 to support additional components. In the illustrated embodiment additional framework 402 is a crossbar extending laterally across the width of the housing 301, but in other embodiments additional framework 402 can be something different than shown; typically, the nature of the additional support structure will depend on the device being supported. In one embodiment, the additional framework can be assembled in the same way as the service panels, and the additional framework can be used for implementing other components, such as fans. Additional framework 402 should not block the path for installing or removing the service panels 304. In the illustrated embodiment the additional component is a fan unit or fan system 404 that can provide forced convection—to the electronic devices positioned in the rack, but other embodiments can include components besides, or in addition to, a fan.

These additional components can be optional, meaning they can be installed on rear module 400 if needed and removed from the module when no longer needed. In addition, the locations of these components can be changed at the rear side of the rack and, at the same time, providing identical functions. For example, the locations of a busbar maybe changed due to different type of servers populated on the rack, it might be in the middle of the module, or the left side or right side of the module. The internal structures (such as the mounting channel shown in FIG. 3 and the mounting framework in FIG. 4) can be preassembled on the module or can be removed and replaced with different ones or identical ones.

Figure 5:
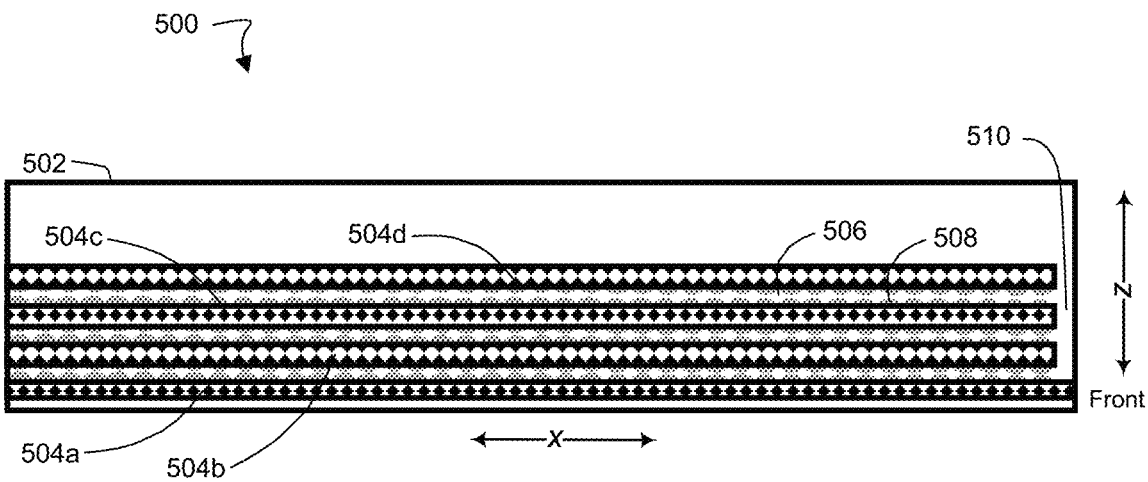
FIG. 5 is a top view of an embodiment of a rear module for use with an electronics rack such as a server rack or an IT rack.

FIG. 5 illustrates another embodiment of a rear module 500. Rear module 500 includes a housing 502 within which are positioned one or more service panels 504. In the illustrated embodiment there are four service panels 504a-504d, but in other embodiments there can be a different number of service panels than shown. Service panels 504 are movably mounted in mounting channels 506, each of which includes bearings 508 to facilitate lateral movement of service panels 504 relative to the mounting channels. In some embodiments bearings 508 can be part of the service panels 504 instead of the mounting channels 502. Opening 510 can be used for inserting and installing service panels 504 on mounting channels 506. Because the mounting channels 506 are spaced apart and substantially parallel to each other, each service panel 504 correspondingly moves in a plane that is spaced apart from the plane in which other panels 504 move. As a result, each service panel 504 can be moved laterally (i.e., in the x direction) independently in the housing without interfering with other service panels.

Figure 6:
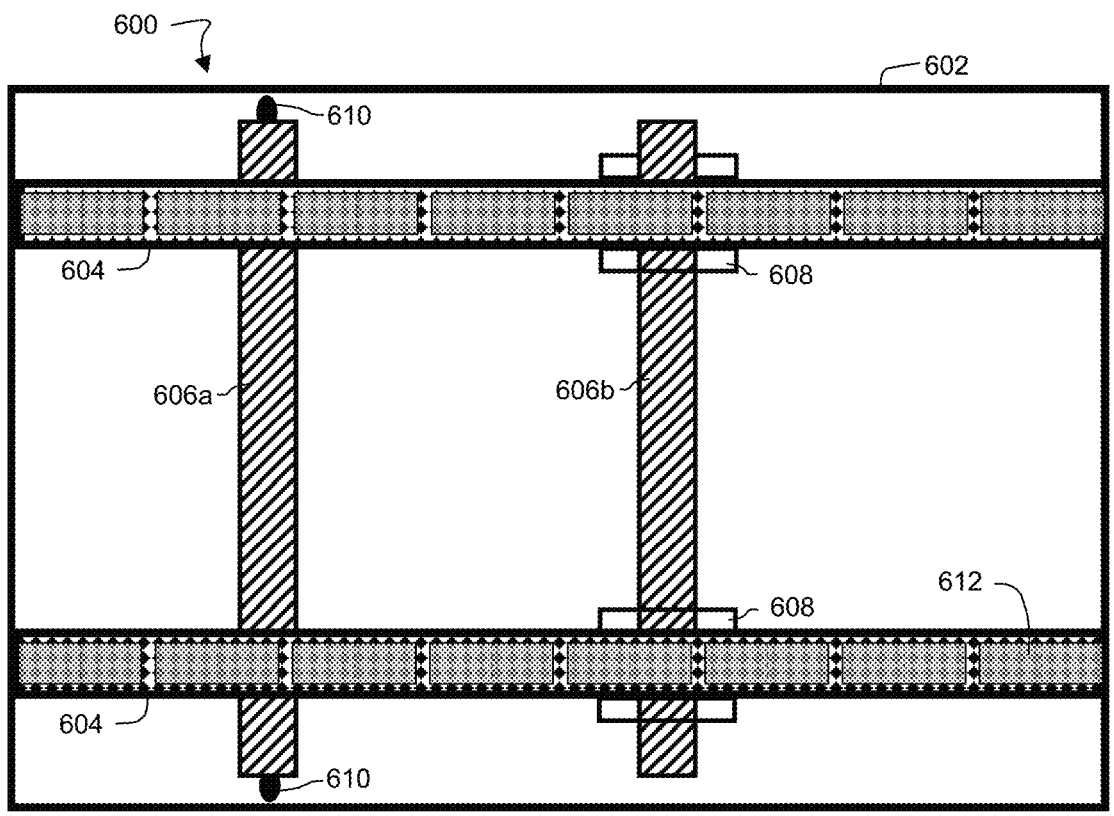
FIG. 6 is a rear view of an embodiment of a rear module for use with an electronics rack such as a server rack or an IT rack.

FIG. 6 illustrates another embodiment of a rear module 600. Rear module 600 includes a housing 602 within which are positioned one or more service panels 606. In the illustrated embodiment there are two service panels 606a-606b, but in other embodiments there can be a different number of service panels than shown. Service panels 606 are movably mounted in mounting channels 604, each of which includes bearings 612 to facilitate lateral movement of service panels 606 relative to mounting channels 604. In some embodiments bearings 612 can be part of the service panels 606 instead of the mounting channels 604. When service panels 606 are in the desired positions within housing 602, they can be locked in position by different means. In the illustrated embodiment service panel 606a is fixed in position by locking bolts 610 that attach service panel 606a to housing 602 or to some other fixed element within housing 602. Service panel 606b is fixed on position by a locking kit 608 that directly couples service panel 606b to at least one of mounting channels 604. Other embodiments can use other methods fixing methods.

Figure 7:
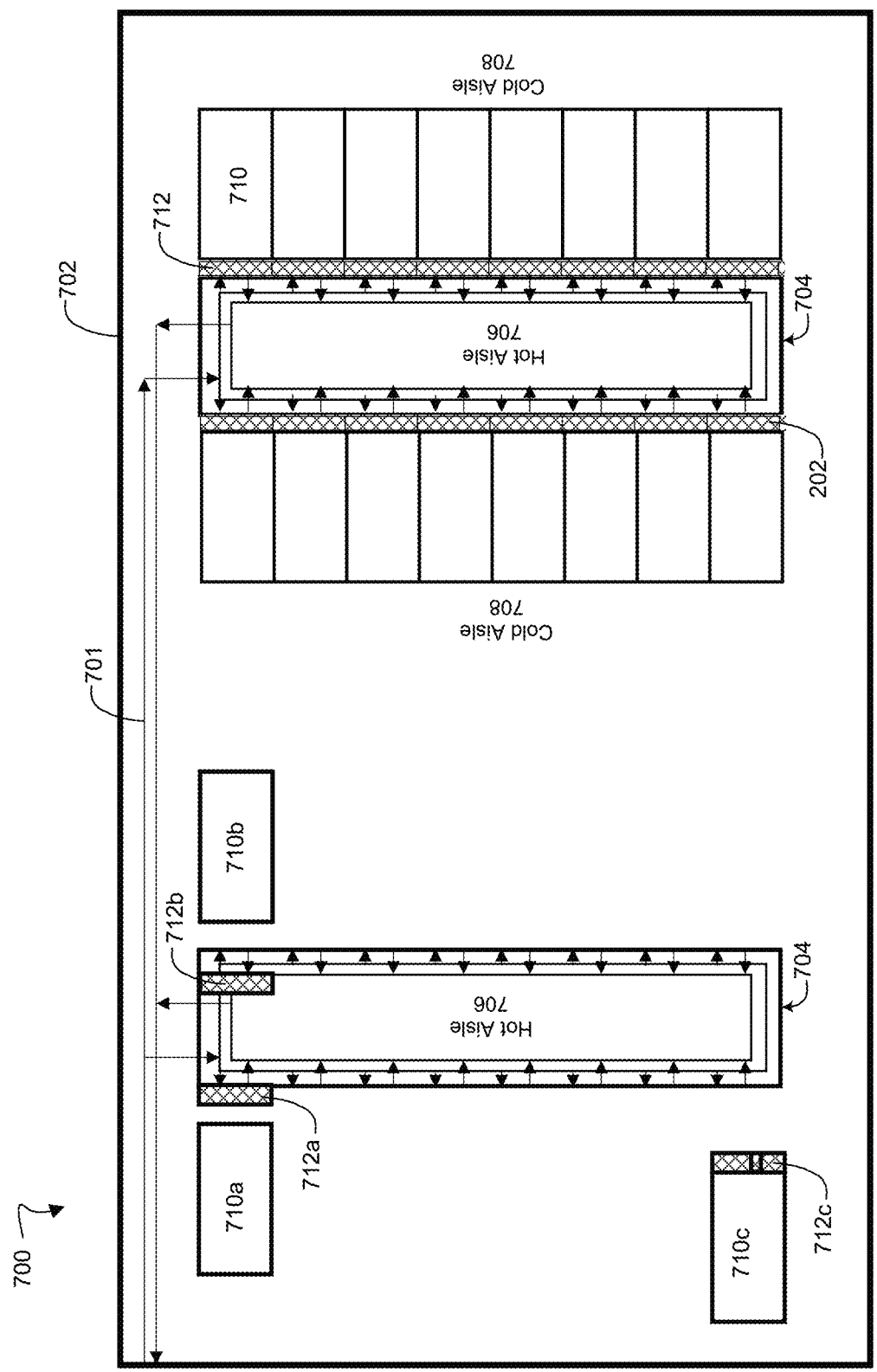
FIG. 7 is a plan view of an embodiment of a data center using electronics racks having a rear module.

FIG. 7 illustrates an embodiment of a data center 700. Data center 700 includes an enclosure 702, which in one embodiment can be a building but in another embodiment can be a subset of a building, such as a room. In the illustrated embodiment, electronic equipment—servers, routers, and the like—within data center 700 is positioned in racks 710 that are arranged in alternating hot aisles 706 and cold aisles 708. In this arrangement, one or more racks 710 are positioned around a data center pod 704 with the rear part of each rack 710 and its corresponding rear module 712 coupled to the data center pod. An interior of data center pod 704 forms the hot aisle 706, which is sandwiched between a pair of cold aisles 708. Each data center pod 704 is coupled to external (i.e., outside the data center) cooling, power, networking, and other services 701. In this arrangement, cool air from cold aisles 708 is drawn into each rack 710 through its front. Hot air is expelled from the back of each rack 710 and rear module 712 into hot aisle 706, from which it is extracted from the building by cooling services 701.

In the illustrated embodiment, racks 710 and rear modules 712 can be assembled in different orders and coupled to data center pods 704 in different ways. In one embodiment, rear module 712c is first coupled to the back of rack 710c, and the rack/module combination can then be coupled to data center pod 704. In other words, the rear module is attached to the rack before the rack moved to the room or before the rack moved to the dedicated locations in the data center. The equipment at this moment can be already assembled within the rear module or not. When done this way for multiple racks, the result is as shown on the right side of the figure, with multiple racks 710 and their corresponding rear modules 712 coupled to an exterior perimeter of pod 704.

In another embodiment, rear module 712a can first be coupled to the exterior side of data center pod 704, and the service panels within it coupled to the appropriate components in the pod 704. Rack 710a can then be rolled into place so that module 712a can be coupled to the rear of rack 710a and coupled to any hardware that is in the rack. Again, the equipment can be assembled any time before powering on the rack. In still another embodiment, rack 710b can first be installed in its location on pod 704, then rear module 712b can be coupled to rack 710b by mounting it on the interior side of pod 704 (i.e., in hot aisle 706) and the service panels within it coupled to the appropriate components in the pod 704. Rack 710b can then be rolled into place so its rear can be coupled to directly to pod 704 and any hardware in the rack can then be coupled to the service panels in rear module 712b. Service panel can be pre-assembled in the rear module or after the set installed.

Figure 8:
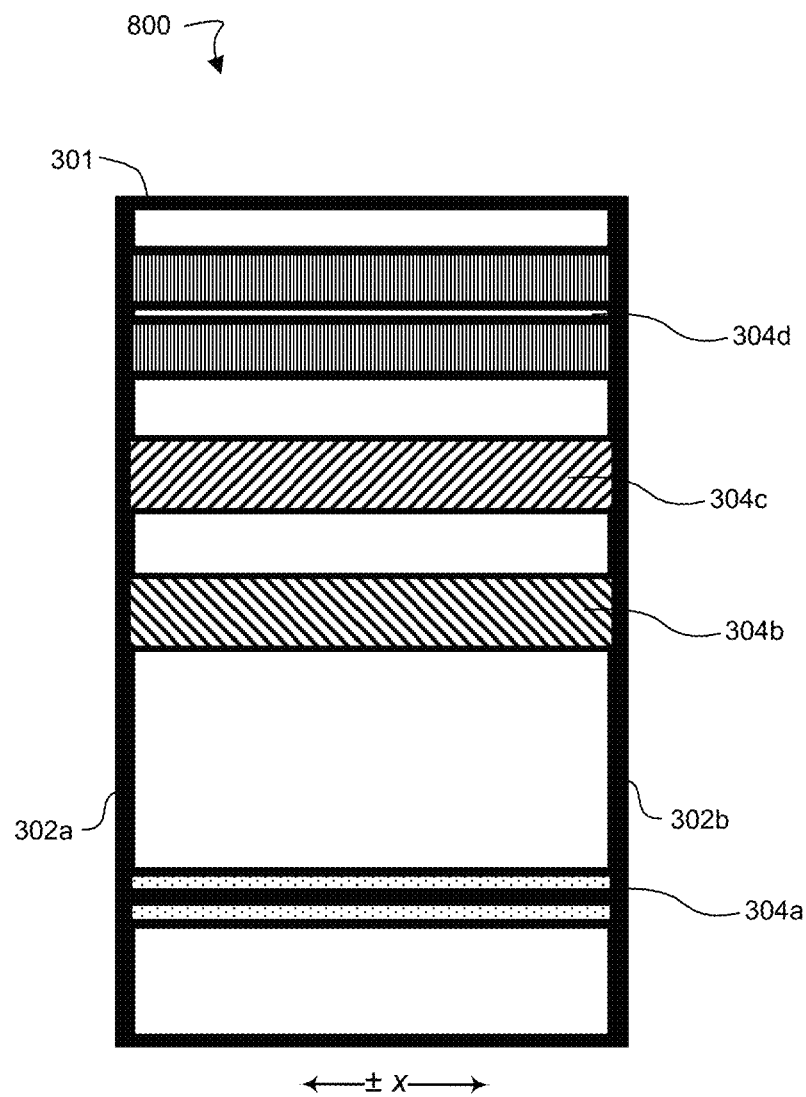
FIG. 8 is a rear view of another embodiment of a rear module for use with an electronics rack such as a server rack or an IT rack.

FIG. 8 illustrates another embodiment of a rear module 800. Rear module 800 is in most respects similar to rear modules 300 and 400: it includes housing 301, mounting channels 302, and service panels 304a-304d. The primary difference between rear module 800 and rear modules 400 and 300 is that in rear module 800 mounting channels 302a and 302b are vertically oriented and positioned along the lateral walls of housing 301. This vertical orientation of mounting channels 302a-302b allows service panels 304a-304d to be horizontal, extending across all or part of the width of housing 301, instead of vertical and extending across all or part of the height of housing 301. The horizontal orientation of service panels 304a-304d provides additional flexibility in configuring the panels to best match the configuration of the hardware in the rack. Another embodiment (not shown) can include both horizontal and vertical mounting channels to enable a combination of both horizontal service panels and vertical panels, providing even further flexibility.

Other embodiments are possible besides the ones described above. For instance:

The solution can be used in any type of data center configurations, rack arrangement fashions;

The locations of the rack modules maybe in different locations, results are similar;

Different internal structure for mounting the equipment and fixing the equipment can be used on the mounting channels;

The above description of embodiments is not intended to be exhaustive or to limit the invention to the described forms. Specific embodiments of, and examples for, the invention are described herein for illustrative purposes, but various modifications are possible.

What is claimed is:

1. A module attachable to an electronics rack, the module comprising:

a housing attachable to a rear part of the electronics rack;

two or more pairs of laterally-running mounting channels positioned within the housing; and two or more service panels positioned within the housing, each service panel being movably mounted to a corresponding pair of mounting channels, wherein each of the two or more service panels can be coupled to at least one electronic device to be mounted in the electronics rack and wherein each service panel can move in its corresponding mounting channels without interfering with another service panel.

2. The module of claim 1, wherein each of the two or more service panels can move laterally in the housing along its corresponding mounting channel.

3. The module of claim 1, wherein each pair of mounting channels is positioned at substantially the same depth within the housing, and wherein the depth within the housing of a pair of mounting channels is different than the depth within the housing of any other pair of mounting channels.

4. The module of claim 3, wherein for each pair of mounting channels one mounting channel is at or near the top of the housing and the other mounting channel is at or near the bottom of the housing.

5. The module of claim 1, wherein the service panels include one or more of:

a fluid distribution manifold panel;

an air-cooling fan system panel;

a power distribution panel;

a busbar power delivery panel; and a high-speed data cable panel.

6. The module of claim 1, further comprising one or both of:

a locking mechanism to lock each service panel in a position on its corresponding mounting channel; and bearings positioned along the mounting channels to allow smooth relative motion between each of the two or more service panels and it corresponding pair of mounting channels.

7. The module of claim 1, further comprising additional framework positioned in the housing to support components other than the service panels.

8. A system comprising:
an electronics rack;
a module attachable to the electronics rack, the module comprising:
a housing attachable to a rear part of the electronics rack;
two or more pairs of laterally-running mounting channels positioned within the housing; and
two or more service panels positioned within the housing, each service panel being movably mounted to a corresponding pair of mounting channels, wherein each of the two or more service panels can be coupled to at least one electronic device to be mounted in the electronics rack and wherein each service panel can move in its corresponding mounting channels without interfering with another service panel.

9. The system of claim 8, wherein each of the two or more service panels can move laterally in the housing along its corresponding mounting channel.

10. The system of claim 8, wherein each pair of mounting channels is positioned at substantially the same depth within the housing, and wherein the depth within the housing of a pair of mounting channels is different than the depth within the housing of any other pair of mounting channels.

11. The system of claim 8, wherein the service panels include one or more of:
a fluid distribution manifold panel;
an air-cooling fan system panel;
a power distribution panel;
a busbar power delivery panel; and
a high-speed data cable panel.

12. The system of claim 8, further comprising a locking mechanism to lock each service panel in a position on its corresponding mounting channel.

13. The system of claim 8, further comprising additional framework positioned in the housing to support components other than the service panels.

14. The system of claim 8, further comprising one or more electronic devices positioned in the electronics rack and coupled to at least one of the two or more service panels.

15. A data center comprising:
a data center pod, the data center pod defining a hot aisle and the data center pod being positioned between a pair of cold aisles;
at least one electronics rack coupled to the data center pod, the electronics rack having a rear module including:
a housing attachable to a rear part of the electronics rack;
two or more pairs of laterally-running mounting channels positioned within the housing; and
two or more service panels positioned within the housing, each service panel being movably mounted to a corresponding pair of mounting channels, wherein each of the two or more service panels can be coupled to at least one electronic device to be mounted in the electronics rack and wherein each service panel can move in its corresponding mounting channels without interfering with another service panel.

16. The data center of claim 15, wherein the electronics rack and the rear module are coupled to the cold aisle side of the data center pod with the rear module positioned between the electronics rack and the data center pod.

17. The data center of claim 15, wherein each of the two or more service panels can move laterally in the housing along its corresponding mounting channel.

18. The data center of claim 15, wherein each pair of mounting channels is positioned at substantially the same depth within the housing, and wherein the depth within the housing of a pair of mounting channels is different than the depth within the housing of any other pair of mounting channels.

19. The data center of claim 15, wherein the service panels include one or more of:
a fluid distribution manifold panel;
an air-cooling fan system panel;
a power distribution panel;
a busbar power delivery panel; and
a high-speed data cable panel.

* * * * *